United States Patent
Appireddygari Venkataramana et al.

(10) Patent No.: US 10,983,717 B1
(45) Date of Patent: Apr. 20, 2021

(54) UNINTERRUPTED BLOCK-BASED RESTORE USING A CONDITIONAL CONSTRUCTION CONTAINER

(71) Applicant: EMC IP Holding Company LLC, Hopkinton, MA (US)

(72) Inventors: Mahesh Reddy Appireddygari Venkataramana, Bangalore (IN); Chetan Battal, Bangalore (IN); Swaroop Shankar D H, Bangalore (IN); Mahantesh Ambaljeri, Bangalore (IN)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 0 days.

(21) Appl. No.: 15/929,438

(22) Filed: May 1, 2020

(51) Int. Cl.
  *G06F 13/00* (2006.01)
  *G06F 3/06* (2006.01)
  *H03M 7/30* (2006.01)

(52) U.S. Cl.
  CPC ............ *G06F 3/0647* (2013.01); *G06F 3/064* (2013.01); *G06F 3/067* (2013.01); *G06F 3/0619* (2013.01); *H03M 7/30* (2013.01)

(58) Field of Classification Search
  CPC ........ G06F 3/0647; G06F 3/064; G06F 3/067; G06F 3/0619; H03M 7/30
  See application file for complete search history.

(56) References Cited

U.S. PATENT DOCUMENTS

| | | | | |
|---|---|---|---|---|
| 2006/0101213 A1* | 5/2006 | Morita | ................ | G06F 11/2082 711/162 |
| 2009/0228761 A1* | 9/2009 | Perlmutter | .............. | G06F 12/08 714/763 |
| 2010/0281207 A1* | 11/2010 | Miller | ................. | G06F 11/1451 711/103 |
| 2012/0254519 A1* | 10/2012 | Ellis | .................... | G06F 12/0246 711/103 |
| 2016/0172058 A1* | 6/2016 | Srivastava | ........... | G11C 29/802 714/6.31 |

* cited by examiner

*Primary Examiner* — Jing-Yih Shyu
(74) *Attorney, Agent, or Firm* — Womble Bond Dickinson (US) LLP

(57) ABSTRACT

A conditional construction container (CCC) provides seamless restore operation during abort event. During normal restore, the CCC assumes a hold state, wherein data blocks are sent from the backup source to the restore host directly. When interrupt occurs, the CCC assumes compression mode, wherein the CCC compresses the data blocks and stores the compressed blocks in memory allocated to the CCC. When the restore operation can resume, the backup agent instructs the CCC to begin data reconstruction operation and the CCC will assume busy mode no longer accepting new data blocks. During the busy state the CCC decompresses the compressed data blocks from the container and reconstruct the original data onto the restore host. Since the container constructed in the memory allocated to the CCC contain data that was obtained upon the interrupt, the restore operation resumes by reconstructing the data from the point of the interrupt seamlessly.

21 Claims, 3 Drawing Sheets

UNINTERRUPTED BLOCK-BASED RESTORE USING A CONDITIONAL CONSTRUCTION CONTAINER

BACKGROUND

Regular backups protect computers and data systems from data loss, worldwide. When backup data is available, a restore session restores the data to a system that has experienced a loss. Unexpected events causing restores to abort are problematic. The need to start successive restores from the point of interrupt to avoid a restore window increase has become of great interest nowadays. For example, while a restore is in progress, and due to some random unintended event, the restore could be aborted abruptly, causing the data to be half written back to the destination device. The restore would then be rolled back after this point resulting in unusable data and a corrupted production environment. Such a situation would also lead to an increase of restore window. Another problem resulting from an aborted restore is that the restore must be restarted from the beginning even though there is some portion of the restore that was already completed.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

According to disclosed aspects, a method for continuous restore operation of data blocks from a backup source to a destination host is provided. Upon initiation of a restore operation, data blocks are fetched from the backup source and sent to the destination host. When an interrupt occurs, data blocks remaining in the backup source are fetched, compressed to generate compressed data blocks, and the compressed data blocks are stored in a temporarily assigned storage location. Upon resumption of the restore operation, the compressed data blocks are fetched from the temporarily assigned storage location, and are decompressed and then the decompressed data blocks are restored onto the destination host. The temporarily assigned storage location is then released.

According to further aspects, a conditional construction container (CCC) operates to provide seamless restore operation and avoid problems associated with an abort event. During a normal restore operation, the CCC assumes a hold state, wherein data blocks are sent from the backup source to the destination host directly. When an interrupt event occurs, the restore agent will issue instructions to the CCC, and the CCC will assume compression mode, wherein the CCC will compress the data blocks and store the compressed blocks in memory dynamically allocated to the CCC. The CCC may store the data blocks in container on the destination host. The backup agent instructs the CCC on which data blocks to store. The CCC will continue to compress blocks until it receives a wait signal from the backup agent. At that point the CCC will revert to hold mode.

When the restore operation can resume, the backup agent instructs the CCC to begin data reconstruction operation. At this point the CCC will assume a busy mode and will no longer accept new data blocks. During the busy state the CCC decompresses the compressed data blocks from the container and reconstruct the original data onto the destination host. Since the containers constructed in the memory allocated to the CCC contain data that was obtained following the interrupt, the restore operation resumes by reconstructing the data from the point of the interrupt seamlessly.

Once all of the reconstruction is completed by the CCC, it notifies the backup agent of the completion and assumes a hold state. The backup agent can continue any further restore operations as needed. At this point, if further interrupt occurs, the process can be repeated by the CCC receiving further data blocks and repeating the process described above.

Since the CCC constructs the container dynamically, where each block in the container contains compressed data blocks, it occupies minimal space in the host. Also, during the process of reconstruction, e.g., when the blocks are processed by CCC, memory allocated to the CCC is deallocated in parallel, thereby clearing the container queue for the next request. Thus, while imposing minimal requirements on the host, the CCC plays vital role in data restore use cases, to achieve optimal uninterrupted restore. With the use of CCC, data reconstruction can be done from the point where the restore was interrupted instead of starting from the start. Also, transmission bandwidth is saved since the data blocks are transferred from the backup source only once.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

Embodiments of the inventive conditional construction container will now be described with reference to the drawings. Different embodiments or their combinations may be used for different applications or to achieve different benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments.

Figure 1:
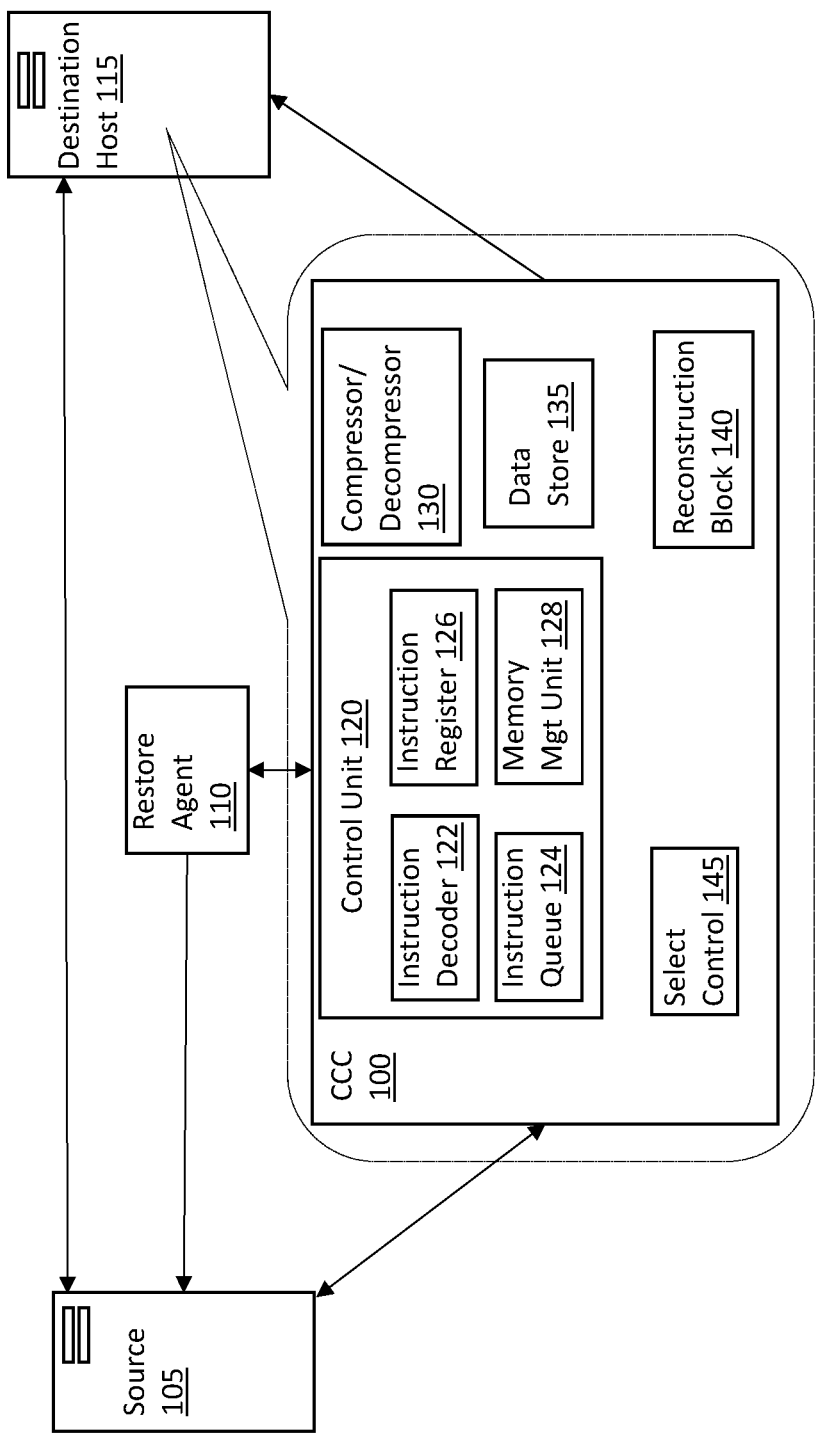
FIG. 1 illustrates an embodiment of a system having conditional construction container.

FIG. 1 illustrates an embodiment wherein data stored in source 105, e.g., a backup server, is to be restored onto destination host 115. The restoration is managed by restore agent 110, which determines the data blocks in source 105 to be restored onto destination host 115. As noted, occasionally an unexpected interrupt event may cause the restoration process to abort. Upon such an occurrence, when the restore process may resume, it is actually required to restart the restore process from the first data block, while discarding the data blocks already restored prior to the interrupt. To avoid such duplication, a conditional construction container (CCC) 100 enables resuming the restore operation from the data block next in queue when the interrupt occurs. The CCC may be a constructor which operates on the incoming data blocks and constructs a container on the destination host and thereafter restore the data onto the destination host.

In the embodiment illustrated in FIG. 1, the CCC 100 includes a control unit 120, compressor/decompressor 130, data store 135, reconstruction block 140 and select control 145. As exemplified by the dotted-line callout, some or all of the parts of the CCC 100 may reside or operate within the destination host 115. Alternatively, some or all of the parts of the CCC 100 may be part of the restore agent 110. Yet according to another alternative some or all of the parts of the CCC 100 may be part of the source 105. Similarly the restore agent 110 may reside or operate within the destination host 115.

During normal restore process, the restore agent 110 issues the instructions to restore data blocks from source 105 (e.g., backup server) to destination host 115. The data blocks can be transferred directly from the source 105 to the destination host 115. During this time the CCC 100 assumes a hold mode, awaiting for instructions from the restore agent 110. Also, the CCC can function as a conduit for transferring the data blocks from the source 105 to the destination host 115. Such a function may be performed by the select control 145, as will be described in more details later below.

When an unexpected interrupt occurs, the restore agent 110 notifies the CCC 100, which exits the hold mode and begins construction activity. In response to list of blocks received from the restore agent 110, the select control 145 starts directing the data blocks to the compressor/decompressor module 130. The compressor/decompressor module 130 compresses the data blocks and stores them in the data store 135, as dynamically assigned by the memory management unit 128. Each data block contains the header information, payload and parity bit. Based on the header and payload information of each block, the compressor/decompressor module 130 encodes and compresses the data blocks and constructs the container on the data store 135, which may be assigned on the destination host 115. Each block in the container contains compressed data block. The CCC 100 will continue to compress data blocks until it receives a wait signal from the restore agent 110, upon which it will resume the hold mode.

When the restore operation can resume, the restore agent 110 send instructions to the CCC 100 to start reconstruction of the data blocks compressed in the container. The CCC 100 then assumes a busy mode and will not accept any new data blocks. The compressed data blocks are then decompressed by compressor/decompressor module 130 and sent to the reconstruction block 140 to reconstruct the data on the destination host 115. Since the restore operation resumes by restoring data blocks from the container in data store 135, the restore operation resumes from the point at which it was interrupted, so that blocks that have already been restored need not be transferred again.

With further reference to the example of FIG. 1, control unit 120 is the brain of the CCC 100. The main components of the control unit 120 are the instruction decoder 122, the instruction queue 124, instruction register 126 and memory management unit (MMU) 128. The instruction to start the compression/decompression, rebuilding the data blocks from the CCC data store 135, data reconstruction and so on are stored in the instruction queue 124. These instructions are decoded in the instruction decoder 122 and sent to instruction register 126 for execution. The MMU 128 is responsible of dynamically managing the storage allocation/deallocation of the CCC data store 135, store requirement for the control unit 120 and other units of CCC 100.

As noted above, the compressor/decompressor block 130 is responsible for compression and decompression of the interrupted restore data blocks. Incidentally, while the compressor/decompressor block 130 is shown as a single unit, it may be made up of separate unit compressor unit and decompressor unit. Once the restore agent 110 receives an interrupt signal during the restore operation, instruction is sent to the CCC 100 via the instruction register 126. Control unit 120 sends the instruction to compressor block 130 to start compressing the interrupted data restore blocks in the data store 135. Once the restore agent 110 initiates the command to start the CCC 100 construction activity, based on the header and payload information of each block the CCC 100 will encode and compress the data blocks.

Once the restore agent 110 receives the restore request in the next cycle, the instructions will be sent to the control unit 120. Control unit 120 then sends the instruction to start the decompression of the compressed data blocks from the data store 135. The decompressed data blocks will be then sent to the data reconstruction block 140.

The data store 135 is a dynamic memory container that holds the compressed blocks during the compression cycle. These memory blocks are dynamically allocated and deallocated during the restore cycle. The MMU 128 in the control unit 120 manages data store 135. The data store 135 occupies relatively small space in the destination host 115 to save the compressed blocks, and memory space is reallocated at the time of reconstruction.

The data reconstruction block 140 is activated in the next restore cycle after the restore was interrupted. The remaining compressed blocks are stored in the data store 135. During the next restore cycle, control unit 120 will detect the saved data blocks and instructs the decompressor block 130 to decompress the data blocks into data reconstruction block 140. The data will be reconstructed from the point of failure and only the remaining data blocks from the backup are restored back to the destination host 115. Data reconstruction block 140 uses the header, payload and parity information to detect the sequence from where it was broken and used for the reconstruction.

The select control 145 functions as a filter or switch to either let restore blocks directly to the destination host 115 or to the compressor/decompressor block 130. During normal operation the CCC 100 will be in the hold state, where the data blocks are not accepted to the CCC data store 135 and will be sent to the destination host directly. Once the interrupt is received during the restore operations, CCC 100 will assume the wait mode, where the data blocks are accepted and sent to the compressor block 130 and in turn sent to the data store 135.

Figures 2, 3:
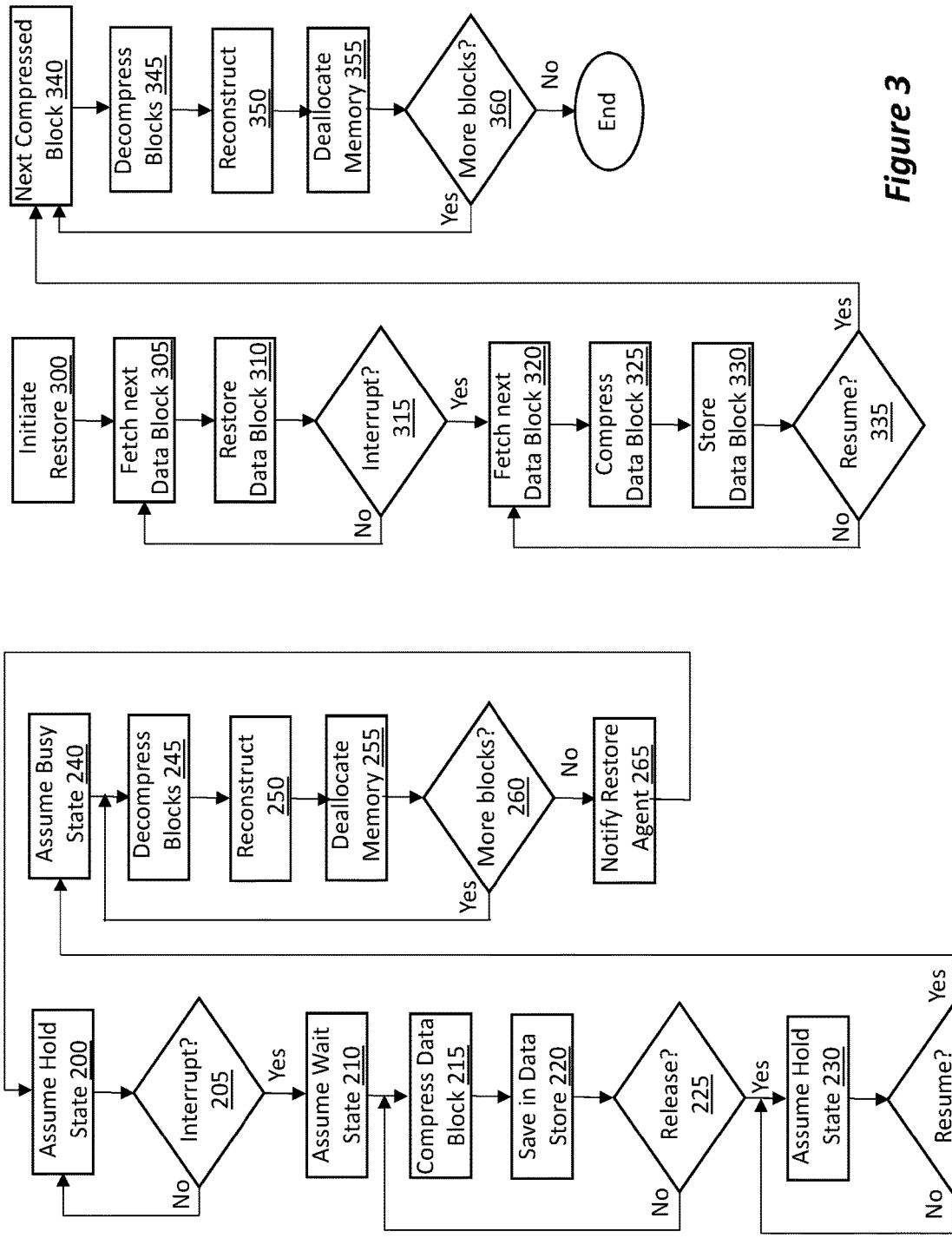
FIG. 2 illustrates a process executed by the conditional construction container according to an embodiment.
FIG. 3 illustrates a process from a system-wide view, according to an embodiment.

FIG. 2 illustrates a process executed by the conditional construction container 100 according to an embodiment. The CCC 100 generally assumes a hold state 200. When restore operation is initiated, the CCC 100 remains in a hold state and data blocks are fetched from the source 105 and restored onto the destination host 115. The select control 145 may be placed on pass-through state, such that data blocks are passed through to the destination host 115.

When an interrupt signal is received at 205, CCC 100 assumes a wait state 210, and the select control 145 is switched to compress state, wherein data blocks from the source 105 are passed to the compressor/decompressor block 130. At 215 the compressor/decompressor block 130 compresses the data blocks and in 220 the compressed data block is saved in data store 135, pre memory allocation by the MMU 128. At 225 it is checked whether a wait signal has been release and, if not, the process reverts to 215 to compressed further data blocks. If a wait release is received, the CCC 100 assumes a hold state at 230 and stops receiving and compressing data blocks.

At 235 it is checked whether a resume restore signal has been received from the restore agent 110 and, if no, the CCC 100 remains in hold state. If a resume restore signal has been received, the CCC 100 assume a busy state at 240 and does not accept any new data blocks. In 245 the compressor/decompressor block 130 decompresses data blocks stored in the data store 135 and the decompressed data store are provided to the reconstruction block 140. At 250 the decompressed data blocks are reconstructed onto the destination host 115. Parallel decompression algorithm is implemented to reconstruct the original data onto the destination host 115. At 255 the MMU 128 deallocate memory in data store 135, that was previously allocated to the compressed data blocks.

When at 260 no more data blocks are found in the data store 135, at 265 the CCC 100 notifies the restore agent 110 and then resumes a hold state at 200.

FIG. 3 illustrates a process from a system-wide view, according to an embodiment. In step 300 a restore operation is being initiated. At this point the restore agent 110 will list the data blocks to be restored from the source machine to the destination machine. A data block is then fetched from the source machine at step 305, and is sent to be restored onto the destination machine at 310. If no interrupt is indicated at 315, the process reverts to step 305 and the next data block as indicated by the restore agent 110 is fetched. Conversely, if an interrupt is indicated in 315, the process proceeds to step 320, wherein the next data block is fetched, but is not sent to be restored on the destination machine 115. Instead, at 325 the data block is compressed and at 330 the compressed data block is store in a dynamically assigned memory space. If at 335 it is not indicated to resume the restore process, i.e., the interrupt is not lifted, the process reverts to step 320 and fetches the next data block. Conversely, if at 335 it is indicated to resume the restore operation, the method proceeds to step 340 wherein the first compressed block is fetched from the assigned memory and at step 345 the compressed data block is decompressed. At 350 the decompressed data block is restored onto the destination machine 115, and at 355 the memory space of the compressed data block is deallocated. If at 360 more compressed blocks are stored in the assigned memory, the process reverts to step 340 to fetch the next compressed data block. If not, the process ends.

In various embodiments, there are various mechanisms for how the restore system routes only the leftover blocks of data to the destination device after a restore interrupt. Generally, upon an interrupt event, the blocks of data from the source device are rerouted to the conditional construction container, where the data blocks are being compressed and stored in the data store memory, which may be on the destination device. When the restore operation resumes, the compressed data blocks from the data store are decompressed and the decompressed data is reconstructed on the destination device.

By this disclosure, a system with an uninterrupted restore process for restoring data blocks from a source device to a destination device is provided, comprising: a data store; a compressor module compressing data blocks and storing the compressed data blocks in the data store; a select control module assuming a pass-through state during normal restore operation thereby enabling passing the data blocks from the source device to the destination device and assuming a compress state upon an interrupt indication to route the data blocks from the source device to the compressor module; a decompressor module decompressing compressed data blocks stored in the data store; a reconstruction module receiving decompressed data blocks from the decompressor module and reconstructing the decompressed data blocks in the destination device; and, a control unit selectively assuming a hold state, a wait state, and a busy state, wherein during the hold state the select control unit assumes a pass-through state, during the wait state the select control assumes a compress state, and during busy state the select control module stops routing the data blocks from the source device to the compressor module and the decompressor module decompresses the compressed data blocks.

Also, by this disclosure, a method is provided for uninterrupted restore operation for restoring data blocks from a source device to a destination device, the method comprising: fetching data blocks from the source device and sending the data blocks to the destination device and restoring the data blocks onto the destination device; upon receiving an interrupt signal, ceasing sending data blocks from the source device to the destination device and fetching remaining data blocks from the source device and compressing the remaining data blocks to obtain compressed data blocks, and storing the compressed data blocks in allocated memory; upon receiving resume signal, fetching the compressed data blocks, decompressing the compressed data blocks, and restoring decompressed data blocks onto the destination device; and, deallocating the allocated memory.

Further, by this disclosure a non-transitory computer-readable medium is provided, having instructions thereupon which, when executed by a processor, cause the processor to: fetch data blocks from a source device and send the data blocks to a destination device and restore the data blocks onto the destination device; upon receiving an interrupt indication, ceasing sending data blocks from the source device to the destination device and instructing a construction unit to initiate compression operation, whereupon the construction unit fetches remaining data blocks from the source device and compresses the remaining data blocks to obtain compressed data blocks, and stores the compressed data blocks in allocated memory; upon receiving resume indication, instructing the construction unit to fetch the compressed data blocks, decompress the compressed data blocks, and restore the decompressed data blocks onto the destination device; and, deallocate the allocated memory.

Additionally, by this disclosure, a system with uninterrupted restore process for restoring data blocks from a source device to a destination device is provided, comprising: a restore agent; a conditional construction unit; and, one or more processors to perform operations, the operations comprising: causing the restore agent to initiate a restore session and provide an indication of data blocks to be restored; fetching data blocks from the source device and sending the data blocks to the destination device; upon receiving an interrupt indication, causing the restore agent to issue an interrupt signal to the conditional construction unit; fetching remaining data blocks from the source device and sending the remaining data blocks to the conditional construction unit; causing the conditional construction unit to compress the remaining data blocks and store compressed data blocks in a container; upon receiving a resume indication, causing the restore agent to issue a restore signal to the conditional construction unit; and, causing the conditional construction unit to decompress the compressed data blocks and restore decompressed data blocks onto the destination device.

And, by this disclosure, a method is provided for operating a constructor unit, comprising: placing the constructor in a hold state while data blocks from a backup source are restored onto a destination host; upon receiving an interrupt indication, placing the constructor unit in a compression mode, and causing the constructor unit to compress received remaining data blocks and store compressed data blocks in allocated memory; upon receiving a resume indication, placing the constructor unit in a busy mode and causing the constructor unit to no longer accept data blocks, and further causing the constructor unit to decompresses the compressed data blocks from the allocated memory and reconstruct decompressed data blocks onto the destination.

Various embodiments of restore systems are described below. Storage systems used therein for backup destination and restore source, or restore destination, could have various forms of storage memory and architecture, and may use compression, deduplication, encryption, error correction and/or other storage system processes in various combinations. Further embodiments of these restore systems are readily devised, with components in separate devices or combined in various devices.

Figure 4:
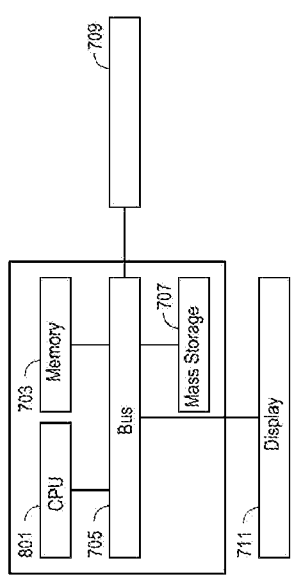
FIG. 4 is an illustration showing an exemplary computing device which may implement the embodiments described herein.

It should be appreciated that the methods described herein may be performed with a digital processing system, such as a conventional, general-purpose computer system. Special purpose computers, which are designed or programmed to perform only one function may be used in the alternative. FIG. 4 is an illustration showing an exemplary computing device which may implement the embodiments described herein. The computing device of FIG. 4 may be used to perform embodiments of the functionality for restore sessions in accordance with some embodiments. The computing device includes a central processing unit (CPU) 801, which is coupled through a bus 705 to a memory 703, and mass storage device 707. Mass storage device 707 represents a persistent data storage device such as a floppy disc drive or a fixed disc drive, which may be local or remote in some embodiments. The mass storage device 707 could implement a backup storage, in some embodiments. Memory 703 may include read only memory, random access memory, etc. Applications resident on the computing device may be stored on or accessed via a computer readable medium such as memory 703 or mass storage device 707 in some embodiments. Applications may also be in the form of modulated electronic signals modulated accessed via a network modem or other network interface of the computing device. It should be appreciated that CPU 801 may be embodied in a general-purpose processor, a special purpose processor, or a specially programmed logic device in some embodiments.

Display 711 is in communication with CPU 701, memory 703, and mass storage device 707, through bus 705. Display 711 is configured to display any visualization tools or reports associated with the system described herein. Input/output device 709 is coupled to bus 705 in order to communicate information in command selections to CPU 801. It should be appreciated that data to and from external devices may be communicated through the input/output device 709. CPU 801 can be defined to execute the functionality described herein to enable the functionality described with reference to FIGS. 1-3. The code embodying this functionality may be stored within memory 703 or mass storage device 707 for execution by a processor such as CPU 801 in some embodiments. The operating system on the computing device may be MS DOS™, MS-WINDOWS™, OS/2™, UNIX™, LINUX™, or other known operating systems. It should be appreciated that the embodiments described herein may also be integrated with a virtualized computing system implemented with physical computing resources.

Figure 5:
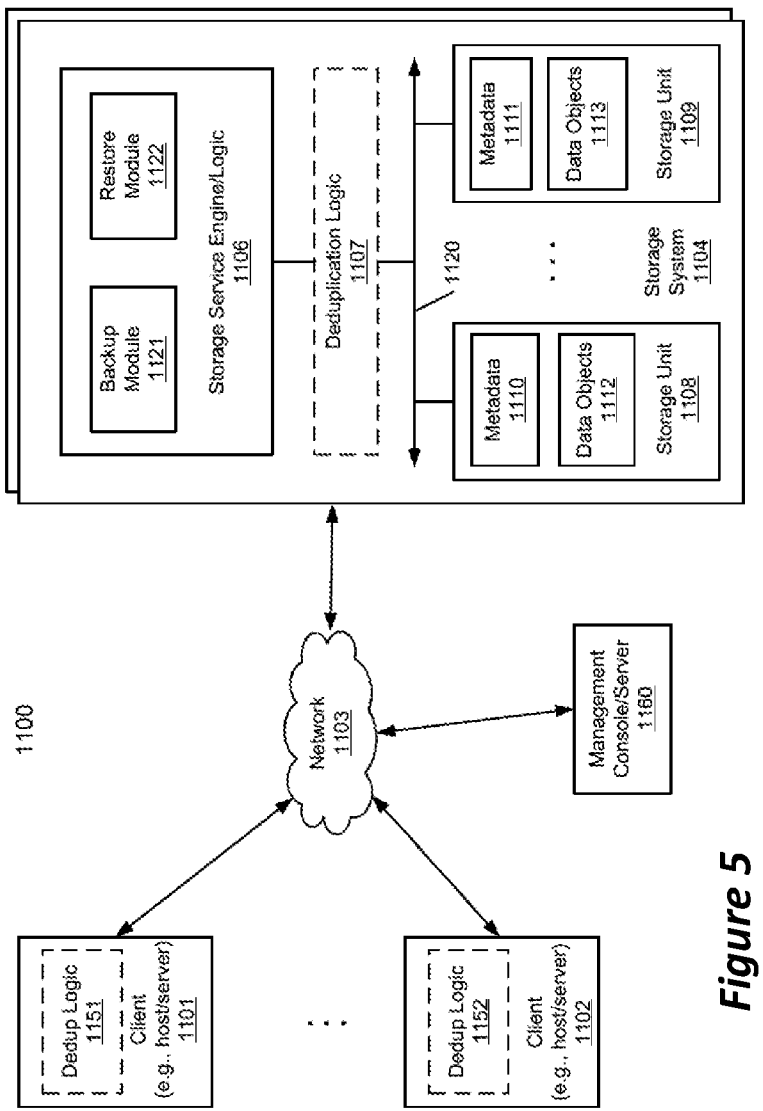
FIG. 5 is a block diagram illustrating a storage system according to one embodiment of the invention.

FIG. 5 is a block diagram illustrating a storage system according to one embodiment of the invention. Referring to FIG. 5, system 1100 includes, but is not limited to, one or more client systems 1101-1102 communicatively coupled to storage system 1104 over network 1103. Clients 1101-1102 may be any type of clients such as a host or server, a personal computer (e.g., desktops, laptops, and tablets), a "thin" client, a personal digital assistant (PDA), a Web enabled appliance, or a mobile phone (e.g., Smartphone), etc. Alternatively, any of clients 1101-1102 may be a primary storage system (e.g., local data center) that provides storage to other local clients, which may periodically back up the content stored therein to a backup storage system (e.g., a disaster recovery site or system), such as storage system 1104. Network 1103 may be any type of networks such as a local area network (LAN), a wide area network (WAN) such as the Internet, a fiber network, a storage network, or a combination thereof, wired or wireless. Clients 1101-1102 may be in physical proximity or may be physically remote from one another. Storage system 1104 may be located in proximity to one, both, or neither of clients 1101-1102. In one embodiment, the hybrid container and the techniques as described above can be implemented in any of the client devices 1101-1102, management server 1160 (e.g., a backup server), and/or storage system 1104.

Storage system 1104 may include or represent any type of servers or a cluster of one or more servers (e.g., cloud servers). For example, storage system 1104 may be a storage server used for various different purposes, such as to provide multiple users or client systems with access to shared data and/or to back up (or restore) data (e.g., mission critical data). Storage system 1104 may provide storage services to clients or users via a variety of access interfaces and/or protocols such as file-based access protocols and block-based access protocols. The file-based access protocols may include the network file system (NFS) protocol, common Internet file system (CIFS) protocol, and direct access file system protocol, etc. The block-based access protocols may include the small computer system interface (SCSI) protocols, Internet SCSI or iSCSI, and Fibre channel (FC) protocol, etc. Storage system 1104 may further provide storage services via an object-based protocol and Hadoop distributed file system (HDFS) protocol.

In one embodiment, storage system 1104 includes, but is not limited to, storage service engine 1106 (also referred to as service logic, service module, or service unit, which may be implemented in software, hardware, or a combination thereof), optional deduplication logic 1107, and one or more storage units or devices 1108-1109 communicatively coupled to each other. Storage service engine 1106 may represent any storage service related components configured or adapted to provide storage services (e.g., storage as a service) to a variety of clients using any of the access protocols set forth above. For example, storage service engine 1106 may include backup logic 1121 and restore logic 1122. Backup logic 1121 is configured to receive and back up data from a client (e.g., clients 1101-1102) and to store the backup data in any one or more of storage units 1108-1109. Restore logic 1122 is configured to retrieve and restore backup data from any one or more of storage units 1108-1109 back to a client (e.g., clients 1101-1102).

Storage units 1108-1109 may be implemented locally (e.g., single node operating environment) or remotely (e.g., multi-node operating environment) via interconnect 1120, which may be a bus and/or a network (e.g., a storage network or a network similar to network 1103). Storage units 1108-1109 may include a single storage device such as a hard disk, a tape drive, a semiconductor memory, multiple storage devices such as a redundant array system (e.g., a redundant array of independent disks (RAID)), a system for storage such as a library system or network attached storage system, or any other appropriate storage device or system. Some of storage units 1108-1109 may be located locally or remotely accessible over a network.

In response to a data file to be stored in storage units 1108-1109, according to one embodiment, deduplication logic 1107 is configured to segment the data file into multiple segments (also referred to as chunks) according to a variety of segmentation policies or rules. Deduplication logic 1107 may choose not to store a segment in a storage unit if the segment has been previously stored in the storage unit. In the event that deduplication logic 1107 chooses not to store the segment in the storage unit, it stores metadata enabling the reconstruction of the file using the previously stored segment. As a result, segments of data files (data objects 1112, 1113) are stored in a deduplicated manner, either within each of storage units 1108-1109 or across at least some of storage units 1108-1109. The metadata, such as metadata 1110-1111, may be stored in at least some of storage units 1108-1109, such that files can be accessed independent of another storage unit. Metadata of each storage unit includes enough information to provide access to the files it contains.

Data deduplication is a process by which a data storage system can detect multiple identical copies of data and only keeps a single copy of that data, thus eliminating the redundant data by removing other copies of that data and thus improving storage utilization. In at least some systems, data deduplication requires iterating over set of data blocks in one or more storage extents, finding the blocks that contain identical information by processing digest information associated with each block and mapping the identical blocks to a single copy of the data. In such systems, an index table of unique digests is created to find commonality among the data set. When a deduplicated data block is updated with a new content, a new data block is created containing the new updated content. Mapping of the deduplicated block is then changed to point to the new data block and the deduplicated block no longer points to the single copy of the data. This process is referred to as reduplication.

Data deduplication can operate at a file or a block level. File deduplication eliminates duplicate files (as in the example above), but block deduplication processes blocks within a file and saves unique copy of each block. For example, if only a few bytes of a document or presentation or a file are changed, only the changed blocks are saved. The changes made to few bytes of the document or the presentation or the file do not constitute an entirely new file. The sharing of file system data blocks conserves data storage for storing files in a data storage system. The snapshot copy facility is a space saving technology that enables sharing of file system data blocks among versions of a file. On the other hand, a deduplication facility enables the sharing of file system data blocks within a file, among versions of a file, between versions of a file and unrelated files, and among unrelated files. Therefore, the deduplication facility eliminates from the data storage system any file system data blocks containing duplicative data content.

Deduplication of data happens in two logically distinct operations: detection and remapping. The detection operation identifies blocks containing the same data. The remapping operation updates address maps that record physical locations of logical units (LUNs) of data so that a single block of data is shared by multiple LUNs or by multiple positions within the same LUN. Detection is accomplished by building a database (e.g., index table) that maintains a digest (e.g., SHA, checksum) and, a deduplication key for each data block. When two data blocks have the same digest they have a sufficiently high probability of containing the same data to warrant a bit-for-bit comparison to confirm they are exact duplicates.

A goal of deduplication logic 1107 is to maintain only a single copy of each unique set of data within a data set. To achieve that goal, deduplication logic 1107 finds data blocks that have not been deduplicated and processes data blocks for deduplication by computing digests for data blocks. A digest is a representation of contents stored in a data block. Further, the digest is mathematically computed (e.g., MD5, SHA-1, SHA-2) in such a way that, computationally, there is a very low or zero probability of finding two data blocks that have the same digest but different contents. If the digest for the data block is sent together with the data block, a recipient of the data block can compute a new digest from the received data block and can compare the new digest with the received digest to determine whether the received data block is valid. Additionally, a digest is stored in an index table in order to process data blocks within the data set for deduplication. Further, a deduplication key identifying a data block is also stored in index table along with the digest for the data block.

A deduplication key uniquely identifies a data block by storing information (such as logical address, physical address) of the data block. Deduplication logic 1107 identifies data blocks that can potentially be deduplicated by comparing digests of data blocks with list of digests stored in the index table. Further, when data blocks are deduplicated after comparing digest information, deduplication logic 1107 updates metadata of deduplicated data blocks. Additionally, deduplication logic 1107 updates metadata of a data block when the data block is reduplicated.

In one embodiment, any of clients 1101-1102 may further include an optional deduplication logic (e.g., deduplication logic 1151-1152) having at least a portion of functionalities of deduplication logic 1107. Deduplication logic 1151-1152 are configured to perform local deduplication operations, respectively. For example, prior to transmit data to storage system 1104, each of the deduplication logic 1151-1152 may deduplicate the data into deduplicated segments and determine whether a particular deduplicated segment has already been stored in storage system 1104. A deduplicated segment is transmitted to storage system 1104 only if the deduplicated segment has not been stored in storage system 1104.

For example, when client 1101 is about to transmit a data stream (e.g., a file or a directory of one or more files) to storage system 1104, deduplication logic 1151 is configured to deduplicate the data stream into deduplicated segments. For each of the deduplicated segments, client 1101 transmits a fingerprint or representative of the deduplicated segment to storage system 1104 to determine whether that particular deduplicated segment has already been stored in storage system 1104. A deduplicated segment that has been stored in storage system 1104 may be previously received from the same client 1101 or from another client such as client 1102. In response to a response from storage system 1104 indicating that the segment has not been stored in storage system 1104, that particular segment is then transmitted over to the storage system 1104. As a result, the network traffic or bandwidth and the processing resources required can be greatly reduced.

In one embodiment, storage system 1104 further includes a storage manager or storage controller (not shown) configured to manage storage resources of storage system 1104, such as, for example, storage space and processing resources (e.g., processor, memory, network resources). The storage manager or controller may be accessed by an administrator of management console or server 1160 remotely via a management or configuration interface (not shown). The administrator can provision and manage storage resources based on a set of policies, rules, and/or service level agreements. The storage resources may be virtualized into a pool of virtual storage resources, where underlying physical storage resources represented by the corresponding virtual storage resources may be implemented locally, remotely (e.g., hosted by another storage system), or both. The virtual storage resources can be provisioned, allocated, and/or defined by an administrator or automatically by the storage manager based on a set of software-defined policies. The virtual storage resources may be represented in one or more virtual machines (e.g., virtual storage systems) managed by one or more virtual machine managers (VMMs). Each of the virtual machines can be provisioned to provide a particular type of storage services (e.g., file-based, block-based, object-based, or HDFS) to a client based on a storage policy or service level agreement associated with that particular client as part of software-defined storage services.

Note that some or all of the components as shown and described above may be implemented in software, hardware, or a combination thereof. For example, such components can be implemented as software installed and stored in a persistent storage device, which can be loaded and executed in a memory by a processor (not shown) to carry out the processes or operations described throughout this application. Alternatively, such components can be implemented as executable code programmed or embedded into dedicated hardware such as an integrated circuit (e.g., an application specific IC or ASIC), a digital signal processor (DSP), or a field programmable gate array (FPGA), which can be accessed via a corresponding driver and/or operating system from an application. Furthermore, such components can be implemented as specific hardware logic in a processor or processor core as part of an instruction set accessible by a software component via one or more specific instructions.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the invention also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present invention are not described with reference to any particular programming language. It will be appreciated that a variety of programming languages may be used to implement the teachings of embodiments of the invention as described herein.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A system with uninterrupted restore process for restoring data blocks from a source device to a destination device, comprising:

a data store;

a compressor module compressing data blocks and storing the compressed data blocks in the data store;

a select control module assuming a pass-through state during normal restore operation thereby enabling passing the data blocks from the source device to the destination device and assuming a compress state upon an interrupt indication to route the data blocks from the source device to the compressor module;

a decompressor module decompressing compressed data blocks stored in the data store;

a reconstruction module receiving decompressed data blocks from the decompressor module and reconstructing the decompressed data blocks in the destination device; and, a control unit selectively assuming a hold state, a wait state, and a busy state, wherein during the hold state the select control module assumes a pass-through state, during the wait state the select control module assumes a compress state, and during busy state the select control module stops routing the data blocks from the source device to the compressor module and the decompressor module decompresses the compressed data blocks.

2. The system of claim 1, further comprising a memory management unit allocating memory for the data store to store the compressed data blocks.

3. The system of claim 2, wherein the memory management unit further deallocates memory when the decompressor module decompresses compressed data blocks.

4. The system of claim 1, further comprising an instruction register storing instructions received from a restore agent.

5. The system of claim 1, wherein the compressor module stores the compressed data blocks by constructing a container on the destination device wherein each block in the container contains the compressed data block.

6. The system of claim 1, further comprising an instruction queue, storing instructions from a restore agent.

7. The system of claim 6, further comprising instruction decoder decoding instructions stored in the instruction queue and sending decoded instructions to an instruction register for execution.

8. The system of claim 1, wherein the data store comprises a dynamic memory container having memory blocks that are dynamically allocated for storing the compressed data blocks and deallocated after decompressing the compressed data blocks.

9. A method for uninterrupted restore operation for restoring data blocks from a source device to a destination device, the method comprising:

fetching data blocks from the source device and sending the data blocks to the destination device and restoring the data blocks onto the destination device;

upon receiving an interrupt signal, ceasing sending data blocks from the source device to the destination device and fetching remaining data blocks from the source device and compressing the remaining data blocks to obtain compressed data blocks, and storing the compressed data blocks in allocated memory;

upon receiving resume signal, fetching the compressed data blocks, decompressing the compressed data blocks, and restoring decompressed data blocks onto the destination device; and, deallocating the allocated memory.

10. The method of claim 9, wherein storing the compressed data blocks in allocated memory comprises constructing a container on the destination device wherein each block in the container contains the compressed data blocks.

11. The method of claim 9, wherein upon receiving resume signal, ceasing fetching remaining data blocks from the source device.

12. The method of claim 9, further comprising maintaining an instruction queue and storing instructions from a restore agent in the instruction queue.

13. The method of claim 9, further comprising dynamically allocating memory to provide said allocated memory.

14. The method of claim 9, further comprising, upon restoring last decompressed data blocks sending a completion signal to a restore agent.

15. A non-transitory computer-readable medium having instructions thereupon which, when executed by a processor, cause the processor to:

fetch data blocks from a source device and send the data blocks to a destination device and restore the data blocks onto the destination device;

upon receiving an interrupt indication, ceasing sending data blocks from the source device to the destination device and instructing a construction unit to initiate compression operation, whereupon the construction unit fetches remaining data blocks from the source device and compresses the remaining data blocks to obtain compressed data blocks, and stores the compressed data blocks in allocated memory;

upon receiving resume indication, instructing the construction unit to fetch the compressed data blocks, decompress the compressed data blocks, and restore the decompressed data blocks onto the destination device; and, deallocate the allocated memory.

16. The computer-readable medium of claim 15, wherein the instructions further cause the processor to:

dynamically allocate memory of said destination device for said allocated memory.

17. The computer-readable medium of claim 16, wherein the instructions further cause the processor to:

construct a container in the allocated memory, wherein each block in the container contains the compressed data blocks.

18. A system with uninterrupted restore process for restoring data blocks from a source device to a destination device, comprising:

a restore agent;

a conditional construction unit; and, one or more processors to perform operations, the operations comprising:

causing the restore agent to initiate a restore session and provide an indication of data blocks to be restored;

fetching data blocks from the source device and sending the data blocks to the destination device;

upon receiving an interrupt indication, causing the restore agent to issue an interrupt signal to the conditional construction unit;

fetching remaining data blocks from the source device and sending the remaining data blocks to the conditional construction unit;

causing the conditional construction unit to compress the remaining data blocks and store compressed data blocks in a container;

upon receiving a resume indication, causing the restore agent to issue a restore signal to the conditional construction unit; and, causing the conditional construction unit to decompress the compressed data blocks and restore decompressed data blocks onto the destination device.

19. The system of claim 18, wherein the operations further comprise causing the conditional construction unit to dynamically allocate memory on the destination device to store said compressed data blocks.

20. A method for operating a constructor unit, comprising:
placing the constructor unit in a hold state while data blocks from a backup source are restored onto a destination host;
upon receiving an interrupt indication, placing the constructor unit in a compression mode, and causing the constructor unit to compress a received remaining data blocks and store compressed data blocks in allocated memory;
upon receiving a resume indication, placing the constructor unit in a busy mode and causing the constructor unit to no longer accept data blocks, and further causing the constructor unit to decompresses the compressed data blocks from the allocated memory and reconstruct decompressed data blocks onto the destination host.

21. The method of claim 20, further comprising dynamically allocating memory of said destination host to provide the allocated memory.

\* \* \* \* \*